(12) United States Patent
Hensley et al.

(10) Patent No.: US 7,405,625 B1
(45) Date of Patent: Jul. 29, 2008

(54) COMMON-MODE CONTROL STRUCTURES AND SIGNAL CONVERTER SYSTEMS FOR USE THEREWITH

(75) Inventors: Joseph Michael Hensley, Lexington, NC (US); Michael R. Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/789,858

(22) Filed: Apr. 25, 2007

(51) Int. Cl.
 *H03F 3/45* (2006.01)
(52) U.S. Cl. .................. 330/285; 330/252; 330/254; 330/260; 341/155; 341/161
(58) Field of Classification Search ............ 330/69, 330/250, 252–272; 341/155, 161
See application file for complete search history.

(56) References Cited

U.S. PATENT DOCUMENTS

| | | | |
|---|---|---|---|
| 5,530,444 A * | 6/1996 | Tice et al. ............... 341/156 |
| 5,933,056 A * | 8/1999 | Rothenberg ............ 330/258 |
| 6,172,636 B1 | 1/2001 | Murden et al. .......... 341/155 |
| 6,265,941 B1 * | 7/2001 | Lopata .................... 330/258 |
| 6,380,806 B1 | 4/2002 | Ang ........................ 330/258 |
| 6,486,820 B1 * | 11/2002 | Allworth et al. ........ 341/161 |
| 6,590,422 B1 * | 7/2003 | Dillon ..................... 326/86 |
| 6,697,001 B1 * | 2/2004 | Oliaei et al. ............. 341/143 |
| 6,778,010 B1 * | 8/2004 | Michalski ................ 330/9 |
| 6,812,784 B2 * | 11/2004 | Michalski ................ 330/9 |
| 6,992,611 B1 | 1/2006 | Lili et al. ................. 341/161 |
| 6,998,917 B2 * | 2/2006 | Kudo et al. .............. 330/258 |
| 7,053,711 B2 * | 5/2006 | Bogner .................... 330/253 |
| 7,138,865 B1 * | 11/2006 | Murden et al. .......... 330/252 |
| 7,142,056 B2 | 11/2006 | Blecker et al. .......... 330/253 |
| 7,167,027 B2 | 1/2007 | Matsuo et al. .......... 327/57 |
| 7,187,229 B2 | 3/2007 | Pelly ....................... 327/551 |
| 7,253,686 B2 * | 8/2007 | Ali ........................... 330/259 |
| 7,265,703 B2 * | 9/2007 | Sasaki et al. ............ 341/161 |
| 7,323,953 B2 * | 1/2008 | Yokoyama et al. ..... 333/187 |
| 7,358,805 B2 * | 4/2008 | Shia et al. ............... 330/69 |
| 2007/0146064 A1 * | 6/2007 | Morie et al. ............ 327/563 |
| 2008/0030273 A1 * | 2/2008 | Gopinathan et al. ... 330/258 |

OTHER PUBLICATIONS

Xia, Bo, et al., "A 10-bit 44-MS/s 20mW Configurable—ADC for a —Reciever", IEEE Journal of Solid-State Circuits, vol. 41, No. 3, Mar. 2006, pp. 530-539.

Yoshioka, Masato, et al., "10-bit, 125MS/s, 40mW Pipelined ADC in 0.18um CMOS", Fujitsu Sci. Tech. Journal, 42.2 Apr. 2006, pp. 248-257.

* cited by examiner

*Primary Examiner*—Linh V Nguyen
(74) *Attorney, Agent, or Firm*—Koppel, Patrick, Heybl & Dawson

(57) ABSTRACT

Control structures are provided to accurately maintain amplifier common-mode levels at the predetermined level of a common-mode reference voltage $V_{cm}$. The disclosed control structures provide amplifier feedback along a first feedback path that is configured to provide high gain and low bandwidth to closely maintain amplifier common-mode level at the predetermined level of a common-mode reference voltage $V_{cm}$. They also provide amplifier feedback along a second feedback path that is configured to provide wide bandwidth to substantially reduce perturbations of the common-mode level that would have otherwise been induced by input signal transients. In an important amplifier feature, these controls are obtained without use of structures (e.g., capacitors and switching transistors) that use substantial current which reduces amplifier efficiency. Although the disclosed control structures may be used in a variety of systems, they are particularly suited for use in samplers and converter stages of pipelined analog-to-digital converters.

20 Claims, 3 Drawing Sheets

COMMON-MODE CONTROL STRUCTURES AND SIGNAL CONVERTER SYSTEMS FOR USE THEREWITH

BACKGROUND OF THE INVENTION

1. Field of the Invention

The present invention relates generally to the control of common-mode signal levels.

2. Description of the Related Art

Pipelined analog-to-digital signal converters are attractive choices for high-speed, high-resolution signal-processing applications. By breaking down the generation of a desired number of digital bits into a cascade (pipeline) of low resolution signal converters, pipelined converter systems achieve high resolution at sampling speeds that are difficult, if not impossible, to realize with other converter systems.

In pipelined systems, each pipeline stage (whether sampler or converter stage) passes an output signal to a succeeding stage for further processing. The accuracy of the conversion process directly corresponds to the accuracy of these output signals. In order to preserve this accuracy, the output signals must be generated with amplifiers that closely control the common-mode level of the output signals at the predetermined level of a common-mode reference voltage $V_{cm}$. In addition, these amplifiers must control the common-mode level with bandwidths that are sufficient to reduce perturbations of the common-mode level that would otherwise have been induced by transients in the analog input signal.

Although amplifier structures have been provided to satisfy these amplifier requirements, they generally operate with structures (e.g., capacitors and switching transistors) that require substantial amplifier current so that they significantly degrade converter efficiency.

BRIEF SUMMARY OF THE INVENTION

The present invention is generally directed to common-mode control structures that enhance efficiency of systems such as pipelined converter systems. The drawings and the following description provide an enabling disclosure and the appended claims particularly point out and distinctly claim disclosed subject matter and equivalents thereof.

DETAILED DESCRIPTION OF THE INVENTION

Figure 1:
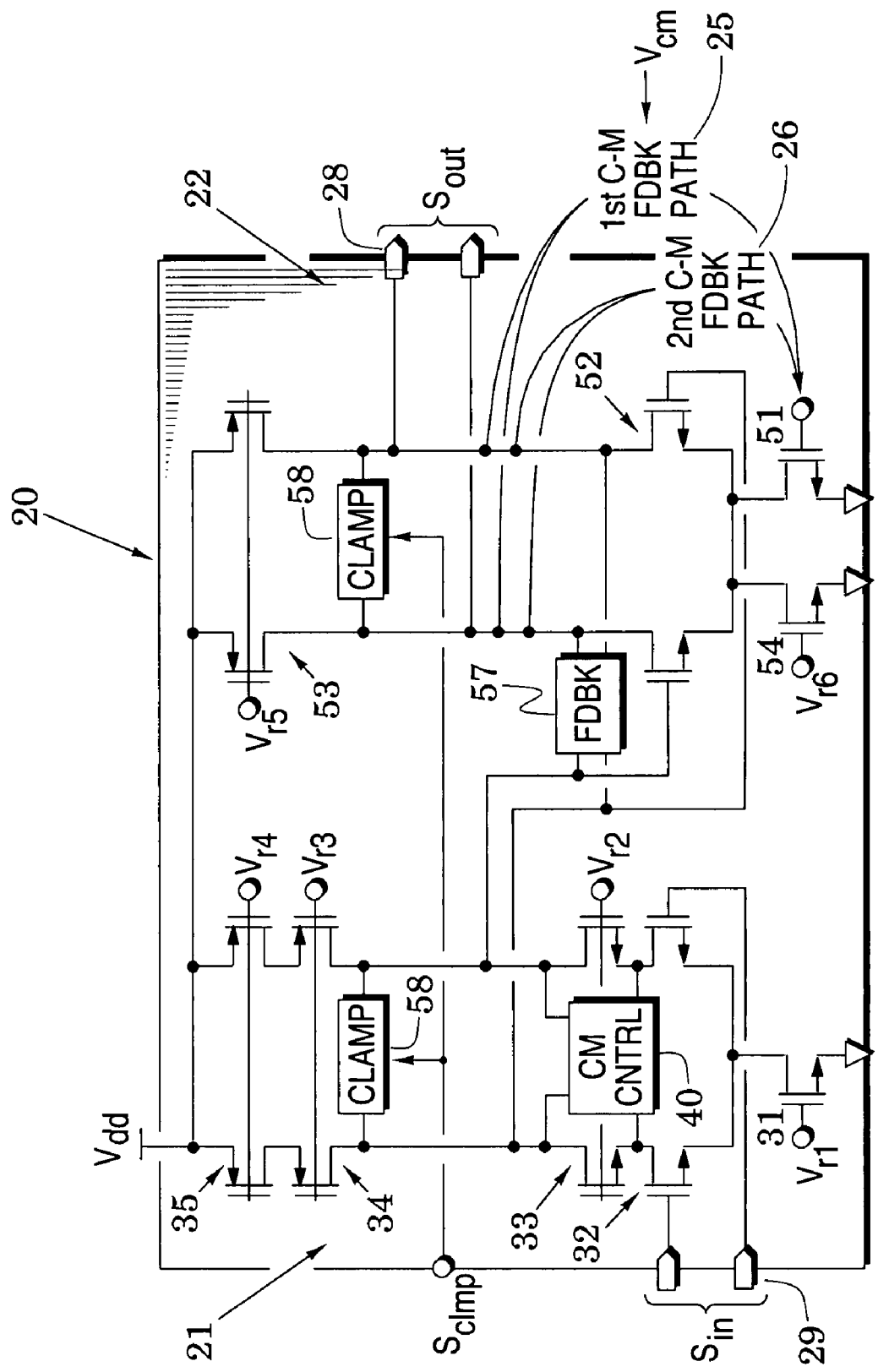
FIG. 1 is a schematic of an embodiment of a two-stage amplifier of the present invention with first and second common-mode control loops provided in the second stage.

FIG. 1 is a schematic of an amplifier 20 that has first and second amplifier stages 21 and 22 which each includes a common-mode control structure. The control structure of the second stage includes a first feedback path 25 that completes a first common-mode control loop which is configured to have a first feedback gain with a first feedback bandwidth. The second stage also includes a second feedback path 26 that completes a second common-mode control loop which is configured to have a second feedback gain which is substantially less than the first feedback gain and a second feedback bandwidth that is substantially greater than the first feedback bandwidth.

Accordingly, the high gain of the first feedback path 25 maintains the common-mode level in an output signal $S_{out}$ at an amplifier output port 28 substantially at the predetermined level of a common-mode reference voltage $V_{cm}$. This reference is generally chosen to enhance the peak-to-peak signal swing of the output stage 22. This control of the output stage's common-mode level is especially important in technologies that operate with a low supply voltage.

Simultaneously, the high bandwidth of the second feedback path 26 substantially reduces perturbations of the common-mode level at the amplifier output port 28 that would have been induced by transient signals (e.g., from switched capacitors in a succeeding converter stage of a pipelined signal converter).

In an important feature of the invention, this control of common-mode level and effective suppression of transients is obtained without use of structures (e.g., capacitors and switching transistors) that use substantial current so that they reduce amplifier efficiency. Accordingly, the control loops of the invention substantially reduce amplifier current drain and enhance amplifier efficiency.

In particular, the first stage 21 includes a current-source transistor 31, an input differential pair 32 of transistors, a cascode pair 33 of transistors, and cascoded pairs 34 and 35 of current-source transistors. The differential pair 32 is arranged to steer a tail current from the current source 31 through the cascode pair 33 and across the cascoded pairs 34 and 35 to thereby generate a first-stage output signal in response to the input signal $S_{in}$. The cascode pair 33 and the cascoded pairs 34 and 35 of current-source transistors substantially enhance the signal gain of the first stage. The current-source transistor 31, the cascode pair 33 and the cascoded pairs 34 and 35 are respectively biased with reference voltages $V_{r1}$, $V_{r2}$, $V_{r3}$ and $V_{r4}$.

The first stage 21 also includes a common-mode control structure 40 that is coupled across the cascode pair 33. This control structure may include transistors that each drive a source of a respective one of the cascode transistors in response to the drain of the other of the cascode transistors. Transistors of this cross-coupled structure set the common-mode level at the output of the first stage with controlled gate-to-source voltages $V_{gs}$.

The second stage 22 includes a current-source transistor 51, an output differential pair 52 of transistors, and a pair 53 of current-source transistors. The differential pair 52 is arranged to steer a tail current from the current source 51 across the pair 53 in order to generate an amplifier output signal $S_{out}$ at the output port 28 in response to the input signal $S_{in}$. The current-source transistor pair 53 is biased with a reference voltage $V_r$.

As described below, the current-source transistor 51 responds to both of the first and second feedback paths 25 and 26. In various embodiments of this feedback operation, it may be preferred that the current-source transistor 51 provides only a portion of the tail current of the differential pair 52. In such embodiments, the remainder of the tail current can be provided by a second current-source transistor 54 that is biased with a reference voltage $V_6$.

Stability of the two-stage amplifier 20 is enhanced with feedback structures 57 that are coupled between output and input terminals of the differential pair 52. These feedback structures are configured to adjust feedback gain and phase to thereby insure amplifier stability (e.g., by insuring sufficient phase margin) while establishing the amplifier's closed-loop bandwidth.

The amplifier 20 provides amplifier features that may be used in a variety of electronic systems. When one of these systems is configured to function during different operational modes, it may be desirable to halt amplifier action during selected ones of these modes. Accordingly, the amplifier 20 also includes clamp circuits 58 that are coupled across the outputs of the first and second stages 21 and 22. In response to a clamp signal $S_{clmp}$, these clamps short the stage, outputs during the selected modes.

As stated above with reference to FIG. 1, the high gain through the first feedback path 25 accurately controls the common-mode level of the second stage 22 while the wide bandwidth through the second feedback path 26 substantially suppresses disturbances in this common-mode level that would have been induced by transient signals. These control features have been realized with switched-capacitor structures that operate in the different operational modes. Although such switched structures are inherently fast, they require additional structures (e.g., capacitors and switching transistors) whose current demands during the switching operations significantly reduce amplifier efficiency.

In contrast, amplifier embodiments of the invention do not require switching operations during operational modes. Instead, they operate continuously so that they eliminate charging currents and thereby significantly enhance amplifier efficiency. This continuous operation is evident in the second stage embodiment 60 of FIG. 2 which includes elements of FIG. 1 with like elements indicated by like reference numbers.

In this second stage embodiment, the first control path 25 includes a first signal divider 62 and a differential amplifier 63. The signal divider 62 is realized as a resistive divider formed with resistors $r_1$. The divider 62 is coupled across the output terminals of the output differential pair 52 to thereby provide a first sense signal $V_{cm1}$ which is one half of the sum of the drain voltages $V_d$ of the differential amplifier 63. The differential amplifier 63 provides a loop feedback signal to the control terminal of the current-source transistor 51 in response to the difference between the first sense signal $V_{cm1}$ and a common-mode reference $V_{cm}$. The common-mode reference signal is generally chosen to enhance the peak-to-peak signal swing of the output stage 22.

The second control path 26 includes a second signal divider 67 which is realized as a resistive divider formed with resistors $r_2$. The divider 67 is coupled across the output terminals of the output differential pair 52 to thereby provide a second sense signal $V_{cm2}$ which is coupled directly to the control terminal of the current-source transistor 51.

In an amplifier embodiment, the first control path 25 also includes a signal inverter in the form of a transistor 64 that is inserted between the output port of the differential amplifier 63 and the control terminal of the current-source transistor 51. A bias current I2 is provided to the inverter transistor 64 by a current-source transistor 65 that is also biased by the reference voltage $V_{r5}$. Preferably, a compensation capacitor 66 is coupled to the output port of the differential amplifier 63 to shape the closed-loop transfer function through the first feedback path 25 to thereby introduce a feedback pole that enhances the control loop's stablility.

Figure 2:
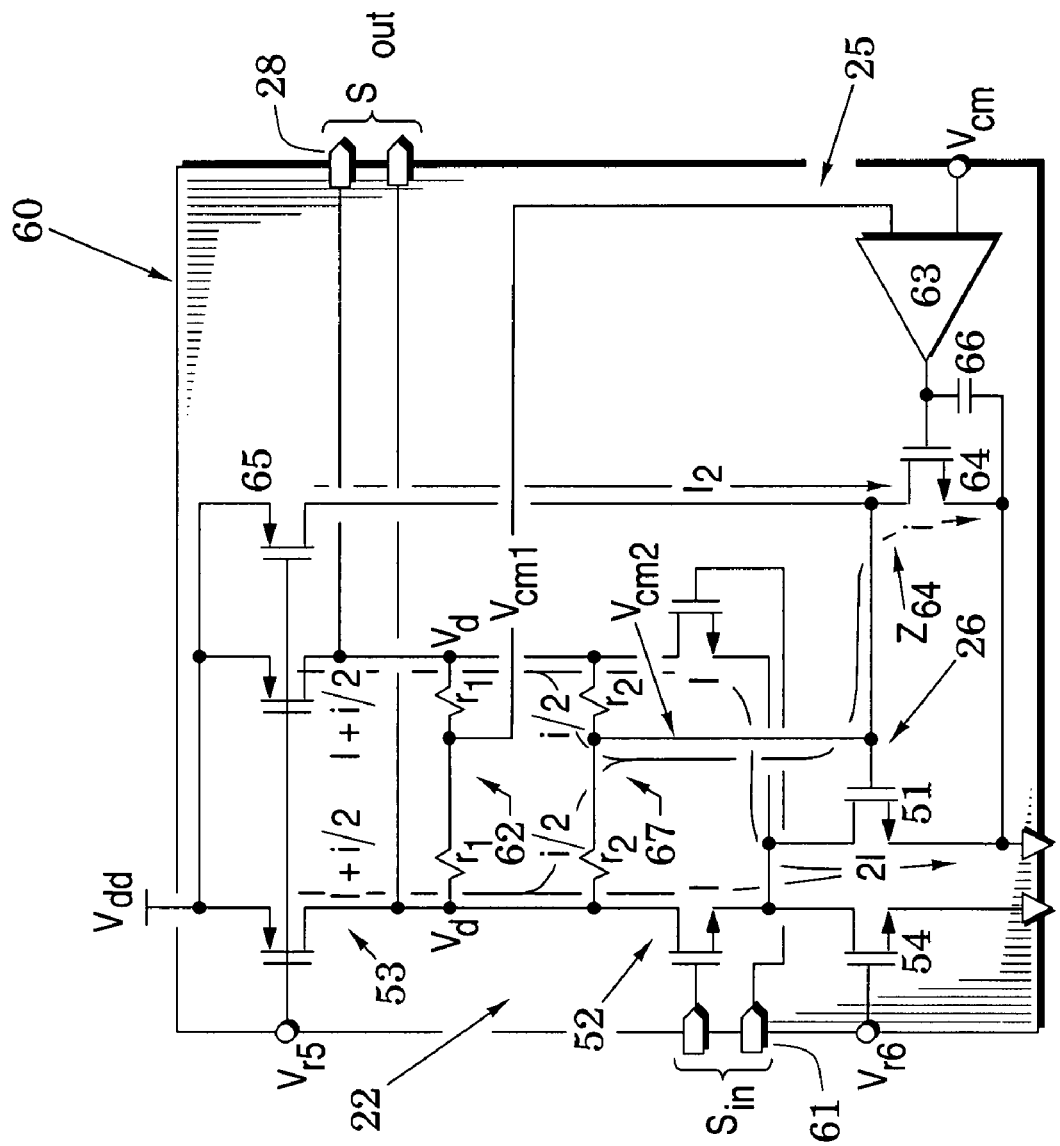
FIG. 2 is a schematic of an embodiment of the second stage of FIG. 1 and its first and second control loops.

The amplifier structures of FIGS. 1 and 2 thus provide high gain and low bandwidth via the first feedback path 25 to control the common-mode level at an amplifier output port 28 substantially equal to the predetermined level of the common-mode reference voltage $V_{cm}$. These amplifier structures also provide low gain and high bandwidth via the second feedback path 26 to substantially reduce perturbations of the output common-mode level that would have been otherwise induced by transient signals.

It is noted and shown that when each of the current-source transistors of the pair 53 provide a current I, these currents I flow down through respective transistors of the differential pair 52 and combine as a tail current 2I in the current-source transistor 51. It is further noted and shown that the inverter transistor 64 pulls a current i which is provided by two currents i/2 that originate in the current-source transistors of the pair 53 and that each flow through a respective one of the resistors $r_2$ of the second signal divider 67. Therefore, the total current through each of the current-source transistors of the pair 53 is I+i/2.

Attention is now directed to the slow control loop which includes the first feedback path 25. This control loop thus includes the current-source transistor 51, the differential pair 52, the signal divider 62, the differential amplifier 63, the compensation capacitor 66, and the inverter transistor 64. This slow loop is completed at the point where it feeds back into the gate of the current-source transistor 51.

The differential amplifier 63 is preferably configured to have a very large gain and a very large input and output impedances. These gains and impedances can be realized with any of various conventional differential amplifier configurations. In addition, the resistors $r_1$ of the first signal divider 62 are also preferably made large to reduce loading of the output of the differential pair 52. It is noted that there is essentially no quiescent current in the resistors $r_1$ because of the high input impedance of the differential amplifier 63.

The combination of these structures provides a high gain around the slow loop and an absence of voltage drop across the resistors $r_1$ so that the drain voltages $V_d$ of the differential pair 52 substantially equal the common-mode reference $V_{cm}$. Since the value of the common-mode reference $V_{cm}$ was chosen to enhance the peak-to-peak signal swing of the output stage 22, the slow control loop will hold the drain voltages $V_d$ at this desired level which enhances the performance of the output stage 60 (and that of the amplifier 20 of FIG. 1).

Stability of the slow loop is realized by selecting the value of the compensation capacitor 66 to position a loop pole that insures sufficient phase margin when the closed-loop gain falls to unity. The slow loop with its first feedback path 25 is thus a high-gain, low-bandwidth control loop that enhances the peak-to-peak signal swing of the output stage 22 because it controls the common-mode level of the output signal at the output port 28 substantially equal to the common-mode reference $V_{cm}$.

Attention is now directed to the fast control loop which includes the second feedback path 26. This control loop includes the current-source transistor 51, the differential pair 52, and the signal divider 67. This fast loop is also completed at the point where it feeds back into the gate of the current-source transistor 51.

The open-loop gain in the fast loop is comparatively low as it is basically a function of the gain of a single transistor, i.e., the current-source transistor 51. This open-loop gain has a dominant pole that is a function of the load capacitance at the amplifier output port 28 and the resistance provided by the output resistance of the pair 53 of current-source transistors in parallel with the resistance at the drains of the differential pair 52. There is also a secondary pole contributed by the parasitic capacitance at the gate of the current-source transistor 51 and the parallel resistance of the resistors $r_2$ of the second signal divider 67.

The fast loop becomes somewhat more complex, however, when the impedance $Z_{64}$ at the drain of the inverter transistor 64 is also considered. This impedance $Z_{64}$ is essentially a ratio of the drain-to-source resistance of the transistor 64 to the gain around the slow-loop path 25. The impedance is thus quite small until the narrow bandwidth of the slow loop rolls off. Because the gain in the fast loop is low, its bandwidth can be set quite high with the loop stability insured by keeping the impedance of the resistors $r_1$ fairly low and by properly setting the current density in the current-source transistor 51 to control its gain and input capacitance. The high loop bandwidth reduces transient perturbations of the amplifier's common-mode level. It is noted that the low impedance of the resistors $r_1$ limits the gain available in the second stage 22. This is not critical, however, as amplifier gain is mostly provided by the first stage (21 in FIG. 1) and the second stage is configured to provide currents to drive loads (e.g., capacitive loads).

As shown in FIG. 2, the currents i/2 flow through the resistors $r_2$ so that there is a voltage drop relative to the common-mode reference $V_{cm}$. This is of no concern, however, because the fast loop is only configured with a wide bandwidth to dampen responses to common-mode disturbances. In the slow loop, the voltage drop across the resistors $r_1$ is essentially zero so that the drain voltages $V_d$ of the differential pair 52 are controlled to substantially equal the common-mode reference $V_{cm}$.

Figure 3:
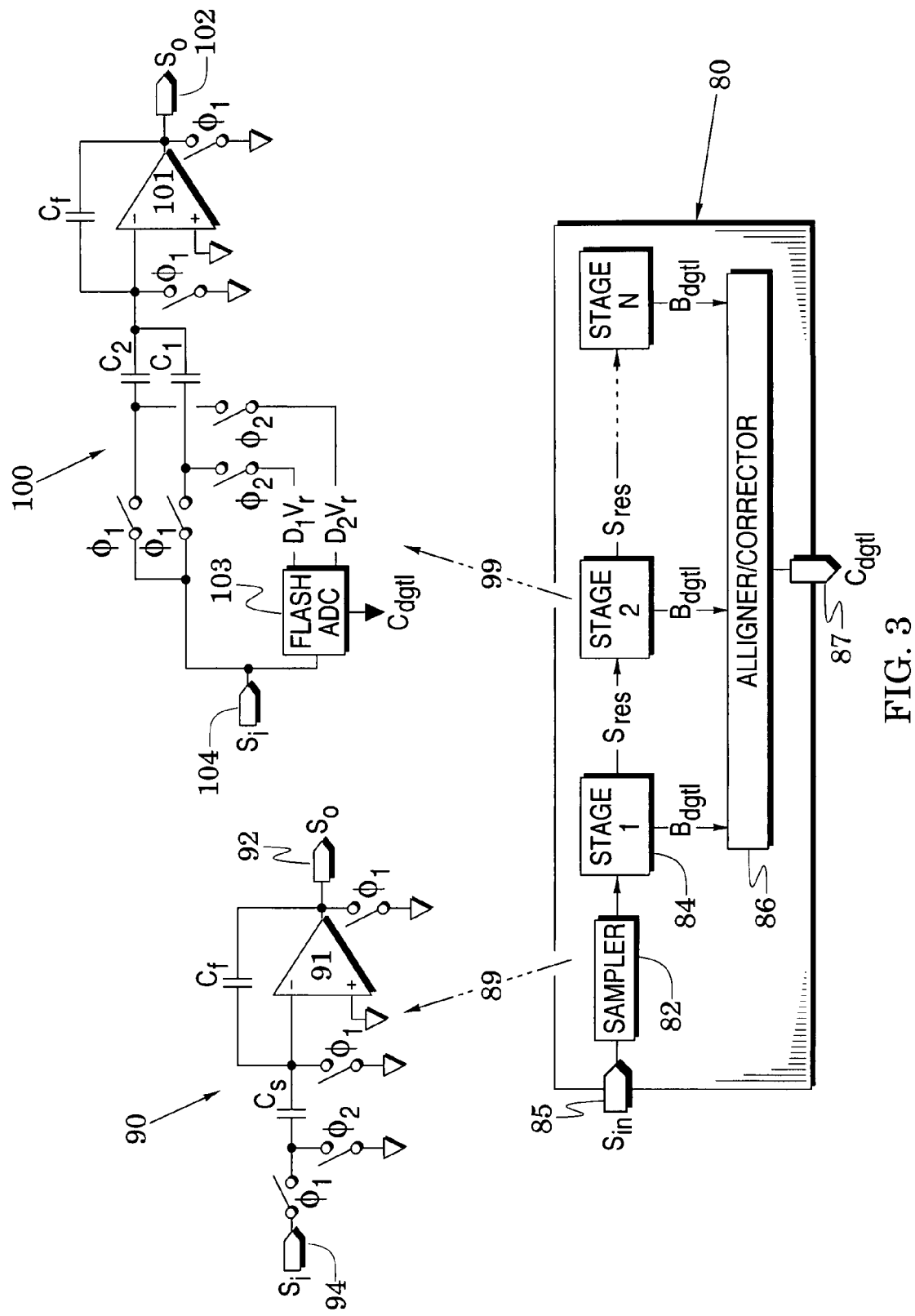
FIG. 3 is a block diagram of a pipelined converter system whose signal sampler and signal converters may be realized with the amplifier structures of FIGS. 1 and 2.

Although they have many useful applications, the disclosed amplifier embodiments are particularly suited for use in samplers and converter stages of pipelined analog-to-digital converters. For example, FIG. 3 illustrates an exemplary pipelined converter 80 that is formed with a signal sampler 82 that is followed by successively-arranged converter stages 84. All but a last one of the stages includes an amplifier that provides an output signal to a succeeding one of the stages.

The system 80 operates in successive clock cycles. In a first one of these clock cycles, the sampler 82 receives an analog signal from an input port 85 and generates an output signal which is a sample of the analog input signal. This sample is passed to the initial one of the converter stages 84 for processing. The initial stage converts this sample to corresponding digital bits $B_{dgtl}$ and provides an output signal to the succeeding one of the stages 84. This output signal represents the residue between the sample and the analog equivalent of the converted digital bits.

During each succeeding clock cycle, this process is repeated by successive converter stages except that the Nth stage has no need to provide an output signal to a succeeding stage. Instead, the Nth stage simply converts the output signal of the preceding stage to corresponding digital bits $B_{dgtl}$.

It is noted that the successive digital bits $B_{dgtl}$ that correspond to the original analog input signal are only present in successive clock cycles. Therefore, an aligner/corrector 86 is provided to successively delay earlier digital codes to thereby temporally align all digital bits $B_{dgtl}$ that correspond to the original analog input signal.

The converter stages are generally configured to provide redundant digital bits which the aligner/corrector 86 processes to correct conversion errors which may occur when the analog input signal is near transition points between analog regions that correspond to adjacent digital codes. The aligned and corrected bits thus provide a digital code $C_{dgtl}$ at an output port 87 that corresponds to the original sample that was provided by the sampler 82.

Example arrow 89 points to an exemplary embodiment 90 of the sampler 82 that is configured to operate in first and second phases (φ1 and φ2) of each clock cycle. The sampler 90 includes an amplifier 91 that provides the desired sample at an output port 92. The sampler also includes a signal capacitor $C_s$ which is coupled to the inverting port of the amplifier and is coupled through a φ1 switch to an input port 94. A feedback capacitor $C_f$ is coupled about the amplifier 91 and φ1 switches ground the input and output of the amplifier 91. In addition, a φ2 switch couples the input side of the signal capacitor $C_s$ to ground.

In the φ1 operational phase, the φ1 switches close so that the signal capacitor $C_s$ receives an electrical charge from the input signal $S_i$ at the input port 94. At the end of this phase, the φ1 switch at the input to the amplifier 91 preferably opens slightly ahead the other φ1 switches to thereby accurately establish the captured input signal. In the φ2 operational phase, the φ2 switches close so that these received charges are transferred to the feedback capacitor $C_f$ (via the amplification of the amplifier 91) to establish a respective analog output signal $S_o$ at the output port 92. The analog output signal thus comprise a sample of the analog input signal at the input port 94 wherein each such sample is provided at the sample rate.

Example arrow 99 points to an exemplary embodiment 100 of the signal converters 84. This embodiment includes an amplifier 101 that drives an output port 102 and a flash analog-to-digital converter (ADC) 103 that is coupled to an input port 104 to receive an input signal $S_i$ that is the output of a preceding converter stage (or the output of the sampler 82).

Similar to the sampler 90, the stage 100 also includes a signal capacitor $C_1$ which is coupled to the inverting port of the amplifier 101 and is coupled through a φ1 switch to the input port 104. The stage 100, however, also includes a second signal capacitor $C_2$ that is coupled to the inverting port of the amplifier 101 and is coupled through a φ1 switch to the input port 104. As in the sampler 90, a feedback capacitor $C_f$ is coupled about the amplifier 101 and φ1 switches ground the input and output of the amplifier 91.

In addition, a switch φ2 couples the input end of the capacitor $C_1$ to receive a signal $D_1 V_{ref}$ in which $V_{ref}$ represents one half of the analog window presented to the stage 100 and $D_1$ is a value that corresponds to the digital code $C_{dgtl}$ generated by the flash ADC. Another switch φ2 couples the input end of the capacitor $C_2$ to receive a signal $D_2 V_{ref}$ in which $D_2$ is another value that corresponds to the digital code $C_{dgtl}$. Pipelined converter stages are configured to convert input signals to predetermined numbers of digital bits and the stage 100 represents an exemplary embodiment that is configured as a 1.5 bit converter.

To enhance the sampling and conversion accuracy of the sampler 90 and the converter stage 100, it is important that the amplifiers 91 and 101 generate output signals whose common-mode levels are controlled to be at the level of a predetermined common-mode reference voltage $V_{cm}$. This reference is purposefully chosen to enhance the amplifier's peak-to-peak signal swing. In the absence of this common-mode control, the generated output signal can be clipped so that it is not an accurate sample of the analog input signal (in the case of the sampler) or is not an accurate residue (in the case of converter stages).

Therefore, conversion accuracy is substantially enhanced when the amplifiers 91 and 101 are configured in accordance with the feedback embodiments disclosed above. In these embodiments, the amplifiers will maintain amplifier common-mode levels at the predetermined level of a common-mode reference voltage $V_{cm}$, substantially reduce perturbations of the common-mode level that would have been induced by signal transients, and operate without use of structures (e.g., capacitors and switching transistors) that reduce amplifier efficiency.

The embodiments of the invention described herein are exemplary and numerous modifications, variations and rearrangements can be readily envisioned to achieve substantially equivalent results, all of which are intended to be embraced within the spirit and scope of the appended claims.

We claim:

1. An amplifier that provides an output signal in response to an input signal and a common-mode reference signal, comprising:
    a transistor that has a control terminal and provides a tail current whose amplitude corresponds to signals at said control terminal;
    a differential pair of transistors that respectively have first and second current terminals and are coupled to steer said tail current between said first and second current terminals in response to said input signal to thereby provide said output signal;
    a first feedback path coupled from said first and second current terminals to said control terminal and configured to provide a feedback signal that responds to said common-mode reference signal and that has a first feedback gain and a first feedback bandwidth; and
    a second feedback path coupled from said first and second current terminals to said control terminal and configured to provide a second feedback gain that is less than said first feedback gain and a second feedback bandwidth that is greater than said first feedback bandwidth.

2. The amplifier of claim 1, wherein said first feedback path includes:
    a first resistive divider coupled across said first and second current terminals to provide a first sense signal; and
    a differential amplifier that provides a feedback signal to said control terminal in response to the difference between said first sense signal and said common-mode reference signal;
    and wherein said second feedback path includes a second resistive divider coupled across said first and second current terminals to provide a second sense signal to said control terminal;
    wherein said differential amplifier has a signal gain greater than the signal gain of said transistor and said first resistive divider has a resistance greater than the resistance of said second resistive divider.

3. The amplifier of claim 2, wherein said differential amplifier has an output port and further including a signal inverter inserted between said output port and said control terminal.

4. The amplifier of claim 3, further including a capacitor coupled to said output port to enhance the stability of said first feedback path.

5. The amplifier of claim 1, further including first and second current sources respectively coupled as loads to said first and second current terminals.

6. An amplifier that provides an output signal in response to an input signal and a common-mode reference signal, comprising:
    a transistor that has a control terminal and provides a tail current whose amplitude corresponds to signals at said control terminal;
    a differential pair of transistors that respectively have first and second current terminals and are coupled to steer said tail current between said first and second current terminals in response to said input signal to thereby provide said output signal;
    a first signal divider coupled across said first and second current terminals to provide a first sense signal;
    a second signal divider coupled across said first and second current terminals to provide a second sense signal to said control terminal; and
    a differential amplifier that provides a feedback signal to said control terminal in response to the difference between said first sense signal and said common-mode reference signal.

7. The amplifier of claim 6, wherein said differential amplifier has an output port and further including a signal inverter inserted between said output port and said control terminal.

8. The amplifier of claim 7, further including a capacitor coupled to said output port to enhance the stability of said feedback signal.

9. The amplifier of claim 7, wherein said signal inverter is a transistor.

10. The amplifier of claim 6, further including first and second current sources respectively coupled to said first and second current terminals.

11. The amplifier of claim 6, wherein said first and second signal dividers respective comprise first and second pairs of series-connected resistors.

12. The amplifier of claim 11, wherein the resistors of said first pair have greater resistances than the resistors of said second pair.

13. The amplifier of claim 6, further including a second transistor coupled to provide a second tail current to said differential pair.

14. The amplifier of claim 6, further including an input differential pair of transistors inserted to amplify said input signal prior to the response of said differential pair.

15. The amplifier of claim 10, wherein said differential pair have a differential input port and further including compensation capacitors coupled between said first and second current terminals and said differential input port.

16. A signal converter system for converting analog input signals into corresponding digital codes, the system comprising:
    a sampler that provides output signals which are samples of said input signal;
    N converter stages that successively process said samples to corresponding digital bits wherein all but a last one of said stages passes output signals in the form of residues to a succeeding stage for processing; and
    an aligner/corrector that provides said corresponding digital code in response to said digital bits;
    wherein at least one of said sampler and said stages generates its respective output signals with an amplifier that includes:
    a transistor that has a control terminal and provides a tail current whose amplitude corresponds to signals at said control terminal;
    a differential pair of transistors that respectively have first and second current terminals and are coupled to steer said tail current between said first and second current terminals to thereby provide said respective output signals;
    a first feedback path coupled from said first and second current terminals to said control terminal and configured to provide a feedback signal that responds to a common-mode reference signal and that has a first feedback gain and a first feedback bandwidth; and
    a second feedback path coupled from said first and second current terminals to said control terminal and configured to provide a second feedback gain that is less than said first feedback gain and a second feedback bandwidth that is greater than said first feedback bandwidth.

17. The system of claim 16, wherein said first feedback path includes:
- a first resistive divider coupled across said first and second current terminals to provide a first sense signal; and
- a differential amplifier that provides a feedback signal to said control terminal in response to the difference between said first sense signal and said common-mode reference signal;
- and wherein said second feedback path includes a second resistive divider coupled across said first and second current terminals to provide a second sense signal to said control terminal;
- wherein said differential amplifier has a signal gain greater than the signal gain of said transistor and said first resistive divider has a resistance greater than the resistance of said second resistive divider.

18. The system of claim 16, wherein said differential amplifier has an output port and further including a signal inverter inserted between said output port and said control terminal.

19. The system of claim 16, further including a capacitor coupled to said output port to enhance the stability of said first feedback path.

20. The system of claim 16, further including first and second current sources respectively coupled as loads to said first and second current terminals.

* * * * *